(12) United States Patent  
Brandt et al.

(10) Patent No.: US 7,844,871 B2  
(45) Date of Patent: Nov. 30, 2010

(54) TEST INTERFACE FOR MEMORY ELEMENTS

(75) Inventors: Uwe Brandt, Boeblingen (DE); Stefan Buettner, Sindelfingen (DE); Werner Juchmes, Boeblingen (DE); Juergen Pille, Stuttgart (DE)

(73) Assignee: International Business Machines Corporation, Armonk, NY (US)

( * ) Notice: Subject to any disclaimer, the term of this patent is extended or adjusted under 35 U.S.C. 154(b) by 192 days.

(21) Appl. No.: 12/268,903

(22) Filed: Nov. 11, 2008

(65) Prior Publication Data

US 2010/0122128 A1 May 13, 2010

(51) Int. Cl.  
*G01R 31/28* (2006.01)

(52) U.S. Cl. ......................... 714/733; 714/718; 714/726

(58) Field of Classification Search .................... 257/48; 714/30, 724, 719, 733, 718, 726  
See application file for complete search history.

(56) References Cited

U.S. PATENT DOCUMENTS

| | | | | |
|---|---|---|---|---|
| 6,073,254 | A * | 6/2000 | Whetsel | 714/30 |
| 6,185,709 | B1 | 2/2001 | Dreibelbis et al. | |
| 6,643,807 | B1 * | 11/2003 | Heaslip et al. | 714/719 |
| 7,161,175 | B2 * | 1/2007 | Shau | 257/48 |
| 7,310,756 | B2 * | 12/2007 | Whetsel | 714/724 |
| 7,340,658 | B2 | 3/2008 | Seuring | |
| 2009/0083592 | A1 * | 3/2009 | Tanaka et al. | 714/718 |

FOREIGN PATENT DOCUMENTS

WO   WO 2008/078229   7/2008

OTHER PUBLICATIONS

Tilman Glökler, "Enabling Large-Scale Pervasive Logic Verification through Multi-Algorithmic Formal Reasoning," pp. 1-8, 2006.  
Dac C. Pham, "Overview of the Architecture, Circuit Design, and Physical Implementation of a First-Generation Cell Processor," pp. 1-18; Jan. 2006.

* cited by examiner

*Primary Examiner*—David Ton

(57) ABSTRACT

A method for testing memory elements of an integrated circuit with an array built in self test (ABIST) comprises providing an ABIST interface to interface between an ABIST engine and a plurality of latches of a memory element under test, providing a multiplex (MUX) stage adjacent a scan input port of each latch, providing functional signal inputs to a data input port of the latches, setting the latches to an ABIST mode by activating an ABIST enable signal and delivering the ABIST enable signal to each of the latches, generating a plurality of ABIST test signals with the ABIST engine, applying the ABIST test signals in parallel to the scan input ports of the latches, determining whether one or more test patterns have been executed, and setting the latches to a normal run mode by deactivating the ABIST enable signal.

1 Claim, 2 Drawing Sheets

TEST INTERFACE FOR MEMORY ELEMENTS

FIELD OF THE INVENTION

The present invention generally relates to the field of testing integrated circuits. In particular, the present invention is directed to an array built in self test (ABIST) interface for testing memory elements of an integrated circuit and a corresponding method of creating and using the same.

BACKGROUND OF THE INVENTION

Memory elements (also called arrays) in integrated circuits are tested by a special test engine, which is sometimes called an array built in self test (ABIST) engine. The ABIST engine is used to apply design-specific test patterns that are generated by a state machine. The purpose of the test patterns is to detect any fail mechanism in the array that is due to the characteristics of the storage element (or cell), such as the physical and/or functional specifics of the cell. The ABIST engine may communicate with the array under test by providing, for example, address, data, and control signals to the array. This communication therefore requires a test interface. Because this interface is considered overhead from a functional point of view, the impact of the interface in terms of area, performance, and power should preferably be minimized.

In existing integrated circuit (IC) designs, the ABIST address, data, and control signals may be multiplexed (MUXed) with the functional address, data, and control signals. This is accomplished, for example, by adding a MUX stage between the functional signals and the ABIST signals. However, a drawback of this arrangement is that the MUX stage, and specifically the corresponding propagation delay, is in the functional path. The position of the MUX stage impacts the cycle time and, thereby, the operating frequency of the array. A further drawback is that a MUX stage is required for each individual address, data, and control bit, which results in the consumption of chip real estate and additional power.

Alternatively, in existing IC designs, the ABIST engine may be interfaced to the array via the logic scan ring. Again, this interface may be controlled by a MUX stage that is placed at the beginning of the scan chain. Because these scan rings are not timing critical, adding a MUX stage has no significant impact on the cycle time or operating frequency. However, a major drawback of this arrangement is that the test data from the ABIST engine needs to be scanned into the latches, which may take many cycles (e.g. a number of cycles equal to the number of latches) and, therefore, may result in excessive test times. Furthermore, for specific cycle-to-cycle tests, such as those where two different addresses are read into two consecutive clock cycles, two or more sets of data must be loaded. As a result, duplication of these latches is required, thus affecting area and power.

Therefore, a need exists for new approaches to interfacing the ABIST engine to memory elements under test in order to optimize chip performance, minimize the amount of chip real estate needed, minimize the amount of power consumption, and minimize test time.

BRIEF SUMMARY OF THE INVENTION

The present invention solves the foregoing problems by providing an array built in self test (ABIST) interface for testing memory elements of an integrated circuit and a method of creating and using the same. In particular, the ABIST interface of the invention may provide a multiplexer stage at the scan input of each individual functional latch for address, data, and control signals of the memory element under test. In this way, there is no MUX stage positioned in a functional path, and the ABIST signals may be applied in a parallel fashion without impacting the performance of the memory element when in the functional mode of operation.

A method of testing memory elements of an integrated circuit by use of the ABIST interface of the present invention may include, but is not limited to, providing an ABIST interface to interface between an ABIST engine and a plurality of latches of a memory element under test, providing a multiplex (MUX) stage adjacent a scan input port of each latch, providing functional signal inputs to a data input port of the latches, setting the latches to an ABIST mode by activating an ABIST enable signal and delivering the ABIST enable signal to each of the latches, generating a plurality of ABIST test signals with the ABIST engine, applying the ABIST test signals in parallel to the scan input ports of the latches, determining whether one or more test patterns have been executed, and setting the latches to a normal run mode by deactivating the ABIST enable signal, wherein setting the latches to the normal run mode disables an ABIST input of each MUX stage and enables the data input port of each latch.

Thus, as will be appreciated by those skilled in the art, latches have two modes: functional and scan. In the functional mode data may be captured from a data in (di) port, while in the scan mode data may be captured from a scan in (si) port. This may be controlled by latch control signals. When a MUX is added before the si port, in scan mode the ABIST enable signal may switch between the std scan mode (where the si connects to a data out (do) of the previous latch) and the ABIST mode (where the si connects to ABIST engine inputs).

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION OF THE INVENTION

Generally speaking, the present invention includes an ABIST interface for testing memory elements of an integrated circuit and a corresponding method of creating and using the same. The ABIST interface of the invention may provide a mechanism to interface the ABIST engine to memory elements under test in a manner that does not impact chip performance, minimizes the amount of chip real estate that is needed, minimizes the amount of power consumption, and minimizes test time. In particular, the ABIST interface of the invention may provide a MUX stage at the scan input (i.e., scan port of the latch) of each individual cell of the memory element under test. In this way, the ABIST signals may be applied in a parallel fashion without impacting the performance of the memory element when in the functional mode of operation. Additionally, the ABIST interface of the invention may allow a full set of test patterns to be applied every clock cycle, which may provide maximum flexibility for cycle-to-cycle tests while minimizing test time.

Figure 1:
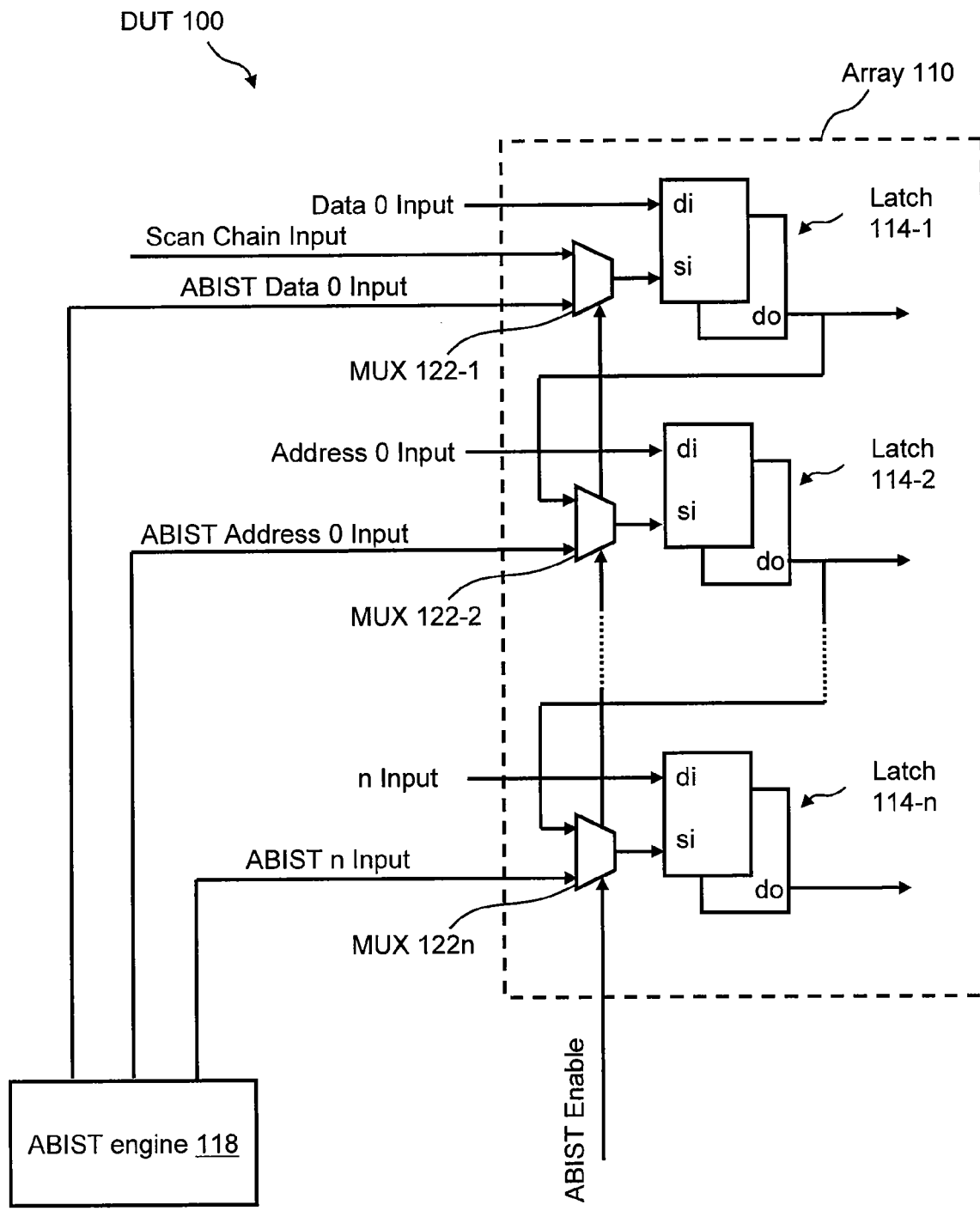
FIG. 1 illustrates a functional block diagram of a device under test that includes one exemplary ABIST interface in accordance with the present invention for testing memory elements of an integrated circuit.

FIG. 1 illustrates a functional block diagram of one exemplary device under test (DUT) 100 that includes one exemplary embodiment of an ABIST interface in accordance with the present invention for testing memory elements of an integrated circuit. As illustrated in FIG. 1, DUT 100 includes an array 110 that interfaces with one or more latches 114. More specifically, latches 114 interface with the storage elements or cells (not shown) to be tested by, for example, an ABIST engine 118, which may be any standard ABIST engine. Array 110 may be, for example, any static random access memory (SRAM) array, dynamic random access memory (DRAM) array, or register array. Array 110 may include, for example, latches 114-1 through 114-n, each of which are associated with a storage element to be tested by ABIST engine 118. Each of the latches may include a data input port and a scan input port. As shown in FIG. 1, the ABIST interface of the present invention may be configured to provide a MUX stage at the scan input port of each individual latch 114 of array 110.

For instance, the exemplary embodiment of FIG. 1 illustrates a plurality of 2-to-1 MUXs 122-1 through 122-n that are connected to the individual scan ports of latches 114-1 through 114-n, respectively. In one embodiment, ABIST engine 118 provides an ABIST Data 0 Input that is multiplexed with the scan input of latch 114-1 via MUX 122-1, an ABIST Address 0 Input that is multiplexed with the scan input of latch 114-2 via MUX 122-2, and an ABIST n Input that is multiplexed with the scan input of latch 114-n via MUX 122-n.

As further illustrated in FIG. 1, an ABIST Enable signal provides a common select line to all MUXs 122. The ABIST Enable signal may be configured such that it is active during ABIST mode and inactive during normal run mode of array 110. For instance, in order to switch the latches into the scan mode from the normal run mode, a local clock buffer may be controlled by a specific signal that activates a specific scan clock to read data applied to the scan input port while at the same time disabling the logic data input port. As will be appreciated by those skilled in the art, this control may be neutral to performance of the array. In order to switch the latches associated with the storage elements from the scan mode back to the normal run mode, a signal may be sent to the latches that enables the data input ports to once again receive the functional signals.

In operation, by use of the ABIST interface of the invention, ABIST engine 118 may deliver a vector of test signals that are multiplexed via MUXs 122-1 through 122-n into the scan ports of latches 114-1 through 114-n, respectively. Therefore the functional address, data, and control paths may not be impacted. Because all latches 114 may be loaded in a single cycle (parallel or broadband load), cycle-to-cycle tests may be applied. Furthermore, because the scan chains are not timing critical, MUXs 122 that are inserted in front of latches 114 may be small, which may in turn minimize area and power requirements. Because of the unique design of the present invention, when not in ABIST mode, the behavior of the logic scan chain is not affected.

One aspect of the ABIST interface of the present invention is that it may apply to all memory elements, such as, but not limited to, SRAMs, DRAMs, and registers, that may be tested by a specific test engine structured to communicate with the memory under test in parallel to the functional path. Another aspect of the ABIST interface of the present invention is that it may be generalized to all functional elements that are tested by a specific test engine. Yet another aspect of the ABIST interface of the present invention is that it may allow parallel or broadband loading because it provides a multiplexer between the logic scan path and the ABIST signal input at every latch stage. Still another aspect of the ABIST interface of the invention is that it may load through the scan port of a functional latch.

Figure 2:
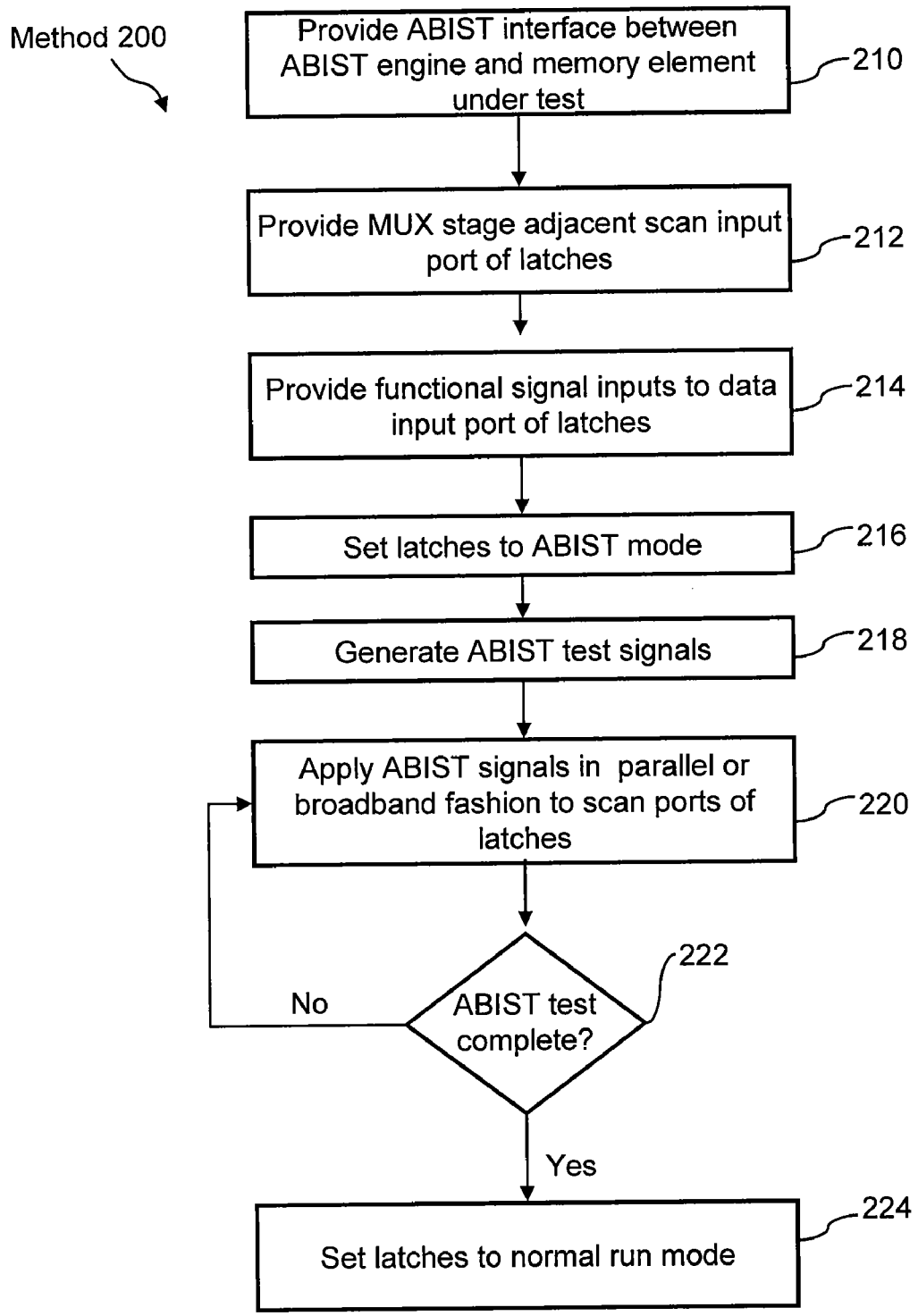
FIG. 2 illustrates a flow diagram of one exemplary method of testing memory elements of an integrated circuit by use of the ABIST interface in accordance with the present invention.

FIG. 2 is a flow diagram illustrating one exemplary method 200 of testing memory elements of an integrated circuit by use of the ABIST interface of the present invention. Method 200 may include, but is not limited to, the following steps.

Method 200 begins at step 210, by providing an ABIST interface between an ABIST engine and a plurality of latches interfacing with a memory element under test. With reference to FIG. 1, the latches may be latches 114 of array 110, and the ABIST engine may be ABIST engine 118. Furthermore, each latch may generally include a data input port and a scan input port.

Next, at step 212, a MUX stage is provided adjacent the scan input port of each latch associated with the memory element under test. With reference to FIG. 1, the MUX stages may be MUX stages 122. Furthermore, each MUX stage may generally include an ABIST input and a scan chain input.

Then, at step 214, functional signal inputs are provided to the data input port of the latches. The functional signal inputs may include, for example, address, data, and control signals.

Method 200 continues at step 216 by setting the latches to an ABIST mode by activating an ABIST enable signal and delivering the ABIST enable signal to each of the latches. The ABIST enable signal may enable the ABIST input of each MUX stage and disable the data input port of each latch.

Next, at step 218, a plurality of ABIST test signals are generated with the ABIST engine.

The ABIST signals generated in step 218 are then applied in parallel or broadband fashion to the scan input ports of the latches in step 220. The ABIST test signals generated in step 218 and applied in step 220 may form one or more test patterns that may be applied to each latch.

Thereafter, method 200 determines whether all of the test patterns have been executed in step 222. If all of the test patterns have been executed, then method 200 proceeds to step 224. However, if all of the test patterns have not been executed, then method 200 returns to step 220.

Finally, in step 224, the latches are set to a normal run mode by deactivating the ABIST enable signal that was activated in step 216 as previously described. In particular, setting the latches to the normal run mode disables the ABIST input of each MUX stage and enables the data input port of each latch.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to as a "circuit," "module" or "system." Furthermore, the present invention may take the form of a computer program product embodied in any tangible medium of expression having computer usable program code embodied in the medium.

The present invention has previously been described with reference to flowchart illustrations and block diagrams of methods, systems and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Although the present invention has been described with reference to preferred embodiments, workers skilled in the art will recognize that changes may be made in form and detail without departing from the spirit and scope of the invention.

What is claimed is:

1. A method for testing memory elements of an integrated circuit with an array built in self test (ABIST) comprising:
   providing an ABIST interface to interface between an ABIST engine and a plurality of latches of a memory element under test, each of the latches having a data input port and a scan input port;
   providing a multiplex (MUX) stage adjacent the scan input port of each latch, each MUX stage having an ABIST input and a scan chain input;
   providing functional signal inputs to the data input port of the latches, wherein the functional signal inputs include address, data, and control signals;
   setting the latches to an ABIST mode by activating an ABIST enable signal and delivering the ABIST enable signal to each of the latches, wherein the ABIST enable signal enables the ABIST input of each MUX stage, enables the scan input port of each latch, and disables the data input port of each latch;
   generating a plurality of ABIST test signals with the ABIST engine;
   applying the ABIST test signals in parallel to the scan input ports of the latches, wherein the ABIST test signals form one or more test patterns that are applied to each latch;
   determining whether all of the test patterns have been executed; and
   setting the latches to a normal run mode by deactivating the ABIST enable signal, wherein setting the latches to the normal run mode disables the ABIST input of each MUX stage and enables the data input port of each latch.

* * * * *